United States Patent [19]

Sekihara et al.

[11] Patent Number: 4,672,320
[45] Date of Patent: Jun. 9, 1987

[54] IMAGING APPARATUS AND METHOD USING NUCLEAR MAGNETIC RESONANCE

[75] Inventors: Kensuke Sekihara, Hachioji; Masao Kuroda; Hideki Kohno, both of Tokyo, all of Japan

[73] Assignee: Hitachi, Ltd., Tokyo, Japan

[21] Appl. No.: 600,159

[22] Filed: Apr. 13, 1984

[30] Foreign Application Priority Data

Apr. 14, 1983 [JP] Japan .................................. 58-66038

[51] Int. Cl.$^4$ ........................................... G01R 33/20
[52] U.S. Cl. ....................................... 324/312; 324/309
[58] Field of Search ................... 324/307, 309, 312; 364/414

[56] References Cited

U.S. PATENT DOCUMENTS

| | | | |
|---|---|---|---|
| 3,924,129 | 12/1975 | Lemay | 364/414 |
| 4,284,950 | 8/1981 | Burl et al. | 324/320 |
| 4,300,096 | 11/1981 | Harrison et al. | 324/309 |
| 4,319,190 | 3/1982 | Brown | 324/309 |
| 4,354,157 | 10/1982 | Feiner | 324/309 |
| 4,425,547 | 1/1984 | Sugimoto | 324/309 |
| 4,506,222 | 3/1985 | Edelstein et al. | 324/309 |
| 4,516,074 | 3/1985 | Sugimoto | 324/309 |
| 4,585,992 | 4/1986 | Maudsley et al. | 324/309 |

FOREIGN PATENT DOCUMENTS 2920549  5/1979  Fed. Rep. of Germany .

OTHER PUBLICATIONS

Kumar et al., NMR Fourier Zeugmatography, Jorn. of Mag. Resonance, vol. 13, 1975, pp. 69–83.
Edelstein et al., Spin Warp NMR Imaging and Applications to Human Whole-Body Imaging, Physics in Medicine & Biology, vol. 25, 1980, pp. 751–756.

Primary Examiner—Stewart J. Levy
Assistant Examiner—Scott M. Oldham
Attorney, Agent, or Firm—Antonelli, Terry & Wands

[57] ABSTRACT

An NMR imaging apparatus and method for direct Fourier imaging. This apparatus includes a static magnetic field generator, gradient magnetic field generators, high-frequency magnetic field generator, signal detecting detector for detecting a nuclear magnetic resonance signal from a body to be inspected, a computer for performing an arithmetic operation for the detected signal to obtain the nuclear magnetic resonance intensity distribution in the to-be-inspected body from measured values of the nuclear magnetic resonance intensity distribution at various points on a rectangular coordinate system in the Fourier space, and memories used for correction. In the imaging apparatus, that distortion of image data obtained by calculation from the detected signal which is caused by the deviation of the intensity of the static magnetic field from a predetermined value or the deviation of the intensity of a gradient magnetic field from a predetermined, linearly-varying intensity, is corrected by those measured values with respect to the above deviation of magnetic field intensity which are previously in the memory, and corrected image data is displayed on a display device.

16 Claims, 5 Drawing Figures

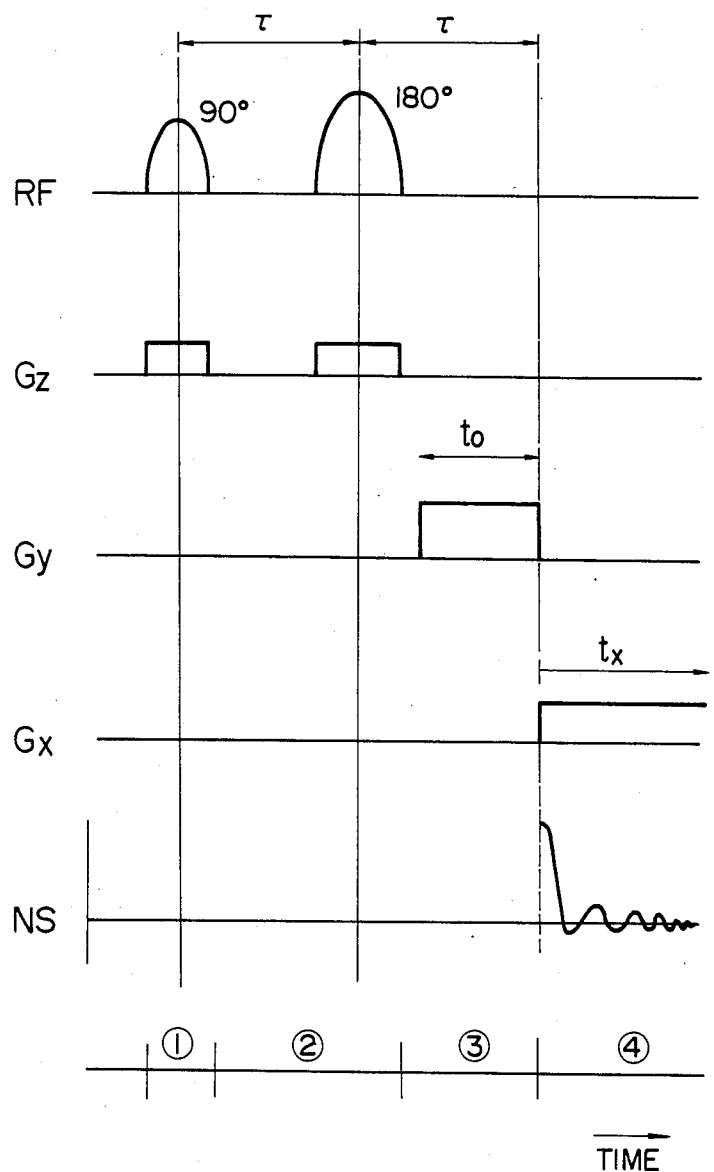

IMAGING APPARATUS AND METHOD USING NUCLEAR MAGNETIC RESONANCE

BACKGROUND OF THE INVENTION

The present invention relates to an imaging apparatus and a method using the nuclear magnetic resonance (hereinafter simply referred to as "NMR"), and more particularly to an NMR imaging apparatus and method which can completely remove the influence of the non-uniformity of a static magnetic field and the non-linearity of a gradient magnetic field upon the image quality of an image formed by NMR imaging.

In an NMR imaging apparatus (hereinafter simply referred to as an "imaging apparatus"), the density distribution or relaxation time distribution of nuclear spin in a body to be inspected, is nondestructively detected by using the NMR phenomenon, and the cross section of a measuring target of the to-be-inspected body is reconstructed on the basis of the above distribution.

The projection-reconstruction method for forming the image of the cross section has been known. In this method, the projection of the spin density distribution or relaxation time distribution in the cross section is formed for various directions, and data thus obtained is processed to reconstruct the spin density distribution or relaxation time distribution in the cross section.

Further, another method for forming the image of the cross section, that is, the so-called direct Fourier imaging method has been known. In this method, the value of the Fourier transform of the spin density distribution or relaxation time distribution in the cross section is directly measured at points on a Cartesian Coordinate Matrix in the Fourier space. The direct Fourier imaging method includes, for example, the Fourier zeugmatography proposed by A. Kumar et al. (refer to Journal of Magnetic Resonance Vol. 13, 1975, pages 69 to 83) and the spin warp imaging proposed by W. A. Edelstein et al. (refer to Physics in Medicine & Biology Vol. 25, 1980, pages 751 to 756).

An imaging apparatus using the direct Fourier imaging method is required to have a static magnetic field having a uniform intensity distribution in a field of view, and a gradient magnetic field superposed on the static magnetic field for giving spatial information to a signal. However, in the case where the intensity distribution of the static magnetic field is non-uniform or the intensity of the gradient magnetic field varies non-linearly, there arises a problem that a geometrical distortion is produced on the image of a cross section.

Further, the non-uniformity of the static magnetic field and the non-linearity of the gradient magnetic field produce an error in the intensity of an image signal. Accordingly, in the case where the intensity distribution of the static magnetic field is extremely non-uniform or the intensity change of the gradient magnetic field is extremely non-linear, undesirable errors in the image intensities are produced.

Incidentally, an imaging apparatus capable of removing the infuence of the non-uniformity of a static magnetic field and the non-linearity of a gradient magnetic field upon an image obtained by the projection-reconstruction method, is disclosed in a Japanese Patent Application (Application No. 23547/1983) entitled "Imaging Apparatus using Nuclear Magnetic Resonance" and filed by the present applicant.

SUMMARY OF THE INVENTION

An object of the present invention is to provide an imaging apparatus and an imaging method using the NMR which can correct the geometrical distortion of an image caused by the non-uniformity of a static magnetic field or the non-linearity of a gradient magnetic field.

Another object of the present invention is to provide an imaging apparatus and an imaging method using the NMR which can eliminate the error in the intensity of image signal caused by the non-uniformity of a static magnetic field or the non-linearity of a gradient magnetic field.

In order to attain the above objects, in an NMR imaging apparatus for direct Fourier imaging according to the present invention, the intensity distribution of a static magnetic field in a field of view and/or the intensity distribution of a gradient magnetic field in the field of view is previously measured, and an image obtained on the basis of the presence of the static and gradient magnetic fields is corrected at each of picture elements on the image, using the measured data.

Now, supplementary explanation will be made on the above correction. In order to facilitate the explanation, the case where a two-dimensional image is formed by the Fourier zeugmatography and the distortion of the image caused by the non-uniformity of a static magnetic field is corrected, will be explained below, by way of example.

Let us denote the distribution to be imaged, the deviation of the intensity of the static magnetic field from a standard value, the intensity increment of a gradient magnetic field having an intensity gradient in an x-direction per unit distance and the intensity increment of a gradient magnetic field having an intensity gradient in a y-direction per unit distance, as $C(x, y)$, $E(x, y)$, $G_x$, and $G_y$, respectively. Then, measured data $S(t_x, t_y)$ is given by the following equation:

$$S(t_x, t_y) = \int C(x, y) \exp[-2\pi j \gamma \{(E(x, y) + G_x x)t_x + (E(x, y) + G_y y)t_y\}] dx dy \qquad (1)$$

where $\gamma$ indicates a gyromagnetic ratio, $t_x$ a period when the gradient magnetic field having an intensity gradient in the x-direction is applied, and $t_y$ a period when the gradient magnetic field having an intensity gradient in the y-direction is applied. It should be noted that $T_1$ and $T_2$ relaxations are neglected in the equation (1).

Now, let us use the following integral variables:

$$\left. \begin{array}{l} x' = x + \dfrac{1}{G_x} E(x, y) \\ y' = y + \dfrac{1}{G_y} E(x, y) \end{array} \right\} \qquad (2)$$

Then, the equation (1) can be changed to the following equation:

$$S(t_x, t_y) = \int C'(x', y') \exp[-2\pi \gamma j (G_x x' t_x + G_y y' t_y)] dx' dy' \qquad (3)$$

where $$C'(x', y') = \frac{C(f_1(x', y'), f_2(x', y'))}{1 + \dfrac{1}{G_y} \dfrac{\partial E(x, y)}{\partial y} + \dfrac{1}{G_x} \dfrac{\partial E(x, y)}{\partial x}} \qquad (4)$$

In the equation (4), $f_1(x', y')$ and $f_2(x', y')$ indicate $X = f_1(x', y')$ and $Y = f_2(x', y')$ which are obtained by solving the equations (2).

In general, the above-mentioned gradient magnetic fields are applied so as to satisfy the following formulae:

$$G_y >> \frac{\partial E(x,y)}{\partial y}, \text{ and } G_x >> \frac{\partial E(x,y)}{\partial x} \quad (5)$$

Accordingly, the equation (4) can be rewritten as follows:

$$C'(x', y') \approx C(f_1(x', y'), f_2(x', y')) \quad (6)$$

When two-dimensional inverse Fourier transformation is carried out for the measured data $S(t_x, t_y)$, the distribution $C'(x', y')$ is obtained as is shown in e.g. (3). It is clear from the formula (6) that the distribution $C'(x', y')$ is considered to be obtained by carrying out the transformation of coordinate system for the original distribution $C(x, y)$ on the basis of the equations (2). In other words, owing to the non-uniformity of the static magnetic field in a field of view, the image of a cross section is subjected to a geometrical distortion which is indicated by the equation (2).

In an ordinary imaging apparatus, a gradient magnetic field having an intensity gradient of 0.2 to 0.3 gauss/cm is used. Further, even a static magnetic field formed by the best one of magnets which are available at the present, has an intensity variation of about $3 \times 10^{-3}$ percent in field of view having a diameter of 40 cm. In such a case, each of a difference x—x' and a difference y—y' approximately corresponds to one picture element and a half. Accordingly, a geometrical distortion on the order of two picture elements will be produced on the image of a cross section.

As mentioned previously, according to the present invention, the deviation $E(x, y)$ of the intensity of a static magnetic field from a standard value is previously measured, and the measured data thus obtained is used for correcting the image $C'(x', y')$ which is affected by the non-linearity of the static magnetic field, on the basis of the relations between coordinates $(x, y)$ and coordinates $(x', y')$ given by the equations (2).

Further, in the case where the intensity change of a gradient magnetic field deviates from a predetermined straight line to some extent, the deviation of the intensity of the gradient magnetic field from a linearly-varying intensity is previously measured together with the above-mentioned deviation $E(x, y)$ with respect to the static magnetic field, and the measured data thus obtained is used for correcting the image $C'(x', y')$ which is affected by the non-uniformity of the static magnetic field and the non-linearity of the gradient magnetic field.

BRIEF DESCRIPTION OF THE DRAWINGS

Other features of the present invention will become apparent from the following detailed description taken in conjunction with the accompanying drawings, in which:

FIGS. 2 to 5 are waveform charts showing different pulse sequences applicable to the embodiment shown in FIG. 1.

DETAILED DESCRIPTION OF THE PREFERRED EMBODIMENT

Figure 1:
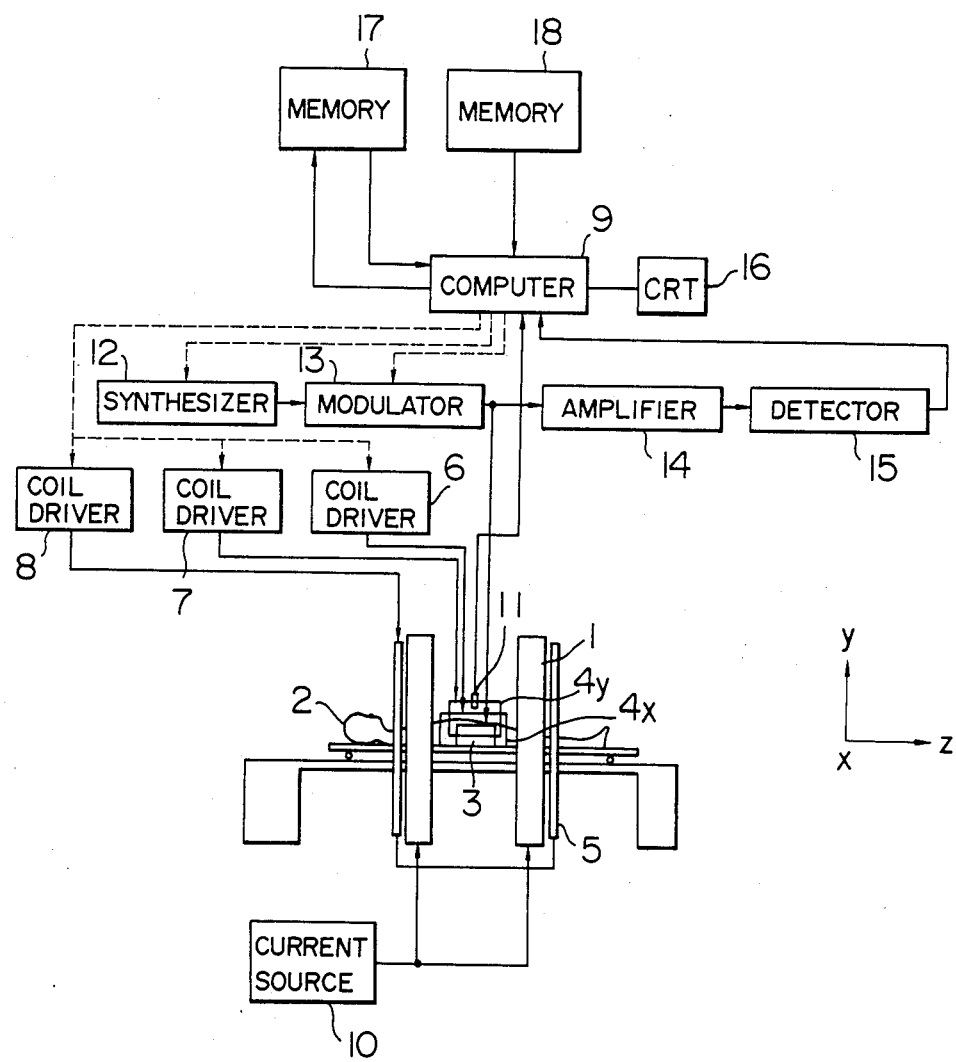
FIG. 1 is a block diagram showing an embodiment of an NMR imaging apparatus according to the present invention.

Now, the present invention will be explained below in detail, with reference to the drawings. FIG. 1 show the outline of an embodiment of an NMR imaging apparatus according to the present invention. In FIG. 1, reference numeral 1 designates a magnet for generating a static magnetic field $H_0$, 2 a body to be inspected, 3 a detecting coil for generating a high-frequency magnetic field and for detecting a signal produced by the to-be-inspected body 2, 4x coil means for generating a gradient magnetic field having an intensity gradient in the x-direction (hereinafter referred to as an "x-gradient magnetic field"), 4y coil means for generating a gradient magnetic field having an intensity gradient in the y-direction (hereinafter referred to as a "y-gradient magnetic field"), and 5 coil means for generating a gradient magnetic field having an intensity gradient in the z-direction (hereinafter referred to as a "z-gradient magnetic field"). Coil drivers 6, 7, and 8 supply currents to the coil means 4x, 4y, and 5, respectively, and each of the coil drivers 6, 7, and 8 is operated by a signal from a computer 9. The coil means 5 is formed of a pair of one-turn coils which are connected so as to be opposite in current direction to each other. The intensity of a gradient magnetic field generated by the coil means 4x, 4y, and 5 can be varied by an instruction from a device 11 for detecting the size of the to-be-inspected body 2 or from the operator of the imaging apparatus. Incidentally, reference numeral 10 designates a current source for supplying an exciting current to the magnet 1.

A high-frequency magnetic field for exciting a nuclear spin is generated in such a manner that a high-frequency signal generated by a synthesizer 12 is shaped and power-amplified by a modulator 13 and a high-frequency current is supplied from the modulator 13 to the coil 3. A signal from the to-be-inspected body 2 is received by the coil 3, and sent through an amplifier 14 to a detector 15, to be subjected to AC-DC conversion. The signal thus treated is applied to the computer 9. Image data $C'(I', J')$ is calculated from the signal supplied to the computer 9, and stored in a memory 17. Since the image data stored in the memory 17 has a distortion, the image data $C'(I', J')$ is corrected by data which is previously stored in a memory 18. Corrected image data $C(I, J)$ is displayed on a CRT display 16.

First, detailed explanation will be made on an example of the correction according to the present invention, that is, the case where the image of a cross section is formed by the two-dimensional Fourier zeugmatography, and the distortion of the image caused by the non-uniformity of a static magnetic field is corrected.

Figure 2:
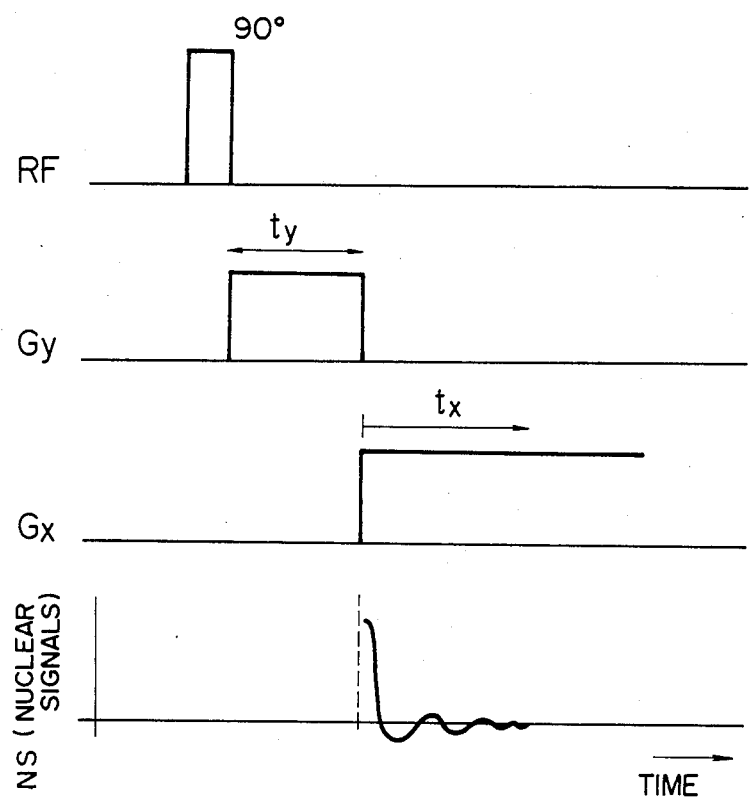

FIG. 2 shows a time when each of a high-frequency pulse (namely, an RF pulse), an x-gradient magnetic field, and a y-gradient magnetic field is applied to carry out the two-dimensional Fourier zuegmatography, and a time when a signal from a nuclear spin is detected. The pulse sequence shown in FIG. 2 is used for forming the image of a desired cross section parallel to the x-y plane. In FIG. 2, reference symbol RF designates an RF pulse, $G_y$ a y-gradient magnetic field having an intensity gradient $G_y$, $G_x$ an x-gradient magnetic field having an intensity gradient $G_x$, and NS a signal from a nuclear spin. As is apparent from FIG. 2, a 90° RF pulse is first applied to a to-be-inspected body, to tilt the nuclear spin in the body by an angle of 90°. Immediately thereafter, the Y-gradient magnetic field is applied for a period $t_y$.

As soon as the period $t_y$ terminates, the X-gradient magnetic field is applied and the observation of NMR signal is started. Using the pulse sequence shown in FIG. 2, the object spin-density is measured on the rectangular coordinate points in the Fourier space. The above measurement is carried out for various values of the period $t_y$. A two-dimensional signal $S(t_x, t_y)$ obtained from such measurement for various values of the period $t_y$ is related to the nuclear spin distribution in the desired cross section, as mentioned below:

$$S(t_x, t_y) = \int C(x, y) \exp\{-2\pi j \gamma (G_x x t_x + G_y y t_y)\} dx dy \quad (7)$$

However, it is to be noted that the equation (7) holds only when the intensity distribution of the static magnetic field is uniform and the intensity of each of the gradient magnetic fields varies linearly in the x- or y-direction, and that a relaxation term is neglected in the equation (7). As can be seen from the equation (7), the nuclear spin distribution (x, y) in the desired cross section can be obtained by carrying out the two-dimensional inverse Fourier transformation for the two-dimensional signal $S(t_x, t_y)$.

The above-mentioned explanation has been made to show the principle of the Fourier zeugmatography.

In the present example, the two-dimensional inverse Fourier transformation is carried out for a measured signal $S(t_x, t_y)$ in accordance with the above principle, and image data thus obtained is stored in the memory 17. However, the data stored in the memory 17 is not discrete values of C(I, J) (where I=0, 1, ..., N−1; J=0, 1, ..., N−1) indicating an actual nuclear spin density distribution C(x, y), but discrete values of C'(I', J') (where I'=0, 1, ..., N−1; J'=0, 1, ..., N−1) indicating the image C'(x', y') which has a distortion due to the non-uniformity of the static magnetic field. For this reason an arithmetic operation for correction performed for the values C'(I', J'), using data with respect to the intensity distribution of the static magnetic field which is previously stored in the memory 18. Thus, data C(I, J) indicating the actual spin density distribution is obtained. The arithmetic operation for correction will be explained below in detail. As is evident from the equations (2), in the case where the intensity of the static magnetic field at a position corresponding to a picture element in the J-th row, the I-th column deviates from a standard value by an amount E(I, J), the actual spin density C(I, J) at this position is equal to the signal intensity C'(ξ, η) at a point having coordinates ξ and η on the image obtained by the inverse Fourier transformation. The coordinates ξ and η are given by the following equations:

$$\left. \begin{array}{l} \xi = I + \dfrac{1}{G_x} E(I, J) \\ \eta = J + \dfrac{1}{G_y} E(I, J) \end{array} \right\} \quad (8)$$

It should be noted that in equation (8), $G_x$ indicates the intensity increment of the X-gradient magnetic field per one picture element, and $G_y$ the intensity increment of the y-gradient magnetic field per one picture element.

The point having the coordinates ξ and η does not always coincide with a picture element in the J'-th row, the I'-th column (where I'=0, 1, ..., or N−1; J=0, 1, ..., or N−1).

In the present example, the deviation E(I, J) of the intensity of the static magnetic field from a standard value is measured at each of the positions corresponding to the picture elements, and the coordinates ξ and η are determined by the equations (8). Then, numeral values i, j, $\Delta_1$, and $\Delta_2$ are determined as follows:

$$i = [\xi],$$

$$j = [\eta],$$

$$\Delta_1 = \xi - i,$$

and $$\Delta_2 = \eta - j \quad (9)$$

These values thus determined are previously stored in the memory 18. Incidentally, the sign [ξ] indicates the greatest integers which do not exceed a value written in the sign [η].

Then, for each of the positions, the following equation is calculated by the computer 9:

$$g = (1-\Delta_1)(1-\Delta_2)C'(i, j) + (1-\Delta_1)\Delta_2 C'(i, j+1) + \Delta_1(1-\Delta_2)C'(i+1, j) + \Delta_1\Delta_2 C'(i+1, j+1) \quad (10)$$

The value g thus obtained is displayed as the nuclear spin density C(I, J) at the position corresponding to the picture element in the J-th row, the I-th column. That is, $$C(I, J) = g \quad (11)$$

In other words, the spin density C(I, J) is determined, by interpolation, from data at four points existing around the point (ξ, η).

In more detail, the values i, j, $\Delta_1$, and $\Delta_2$ with respect to the position corresponding to the picture element in the J-th row, the I-th column are fetched from the memory 18 into the computer 9, to calculate values (i+1), (j+1), (1−$\Delta_1$), and (1−$\Delta_2$). Then, data C'(i, j), C'(i+1, j), C'(i, j+1), and C'(i+1, j+1) are fetched from the memory 17, to calculate the equation (10). The result of the calculation is used as corrected image data for the picture element in the J-th row, the I-th column. The above processing is performed for all of the picture elements, and the results of such processing are displayed on the CRT display 16. In the image C(I, j) thus obtained, the distortion due to the non-uniformity of the static magnetic field will be removed, if an error caused by interpolation can be neglected.

In the above example, the values i, j, $\Delta_1$ and $\Delta_2$ stored in the memory 18 can be previously calculated by an external, large-sized computer. However, in the case where the computer 9 has sufficient processing capability the above calculation can be performed by the computer 9. In this case, the data E(I, J) (where I=0, 1, ..., N−1; J=0, 1, ..., N−1) with respect to the static magnetic field is stored in the memory 18. In order to determine the spin density C(I, J), the data E(I, J) at the position corresponding to the picture element in the J-th row, the I-th column is first fetched from the memory 18, and the coordinates ξ and η are calculated from the equations (8). Then, the values i, j, $\Delta_1$, and $\Delta_2$ are determined from the equations (9).

Next, explanation will be made on another example of the correction according to the present invention, that is, the case where the distortion of an image caused by both the non-uniformity of a static magnetic field and the non-linearity of gradient magnetic fields is corrected. This correction also can be carried out by the embodiment shown in FIG. 1.

First, the principle of correction in the present example will be explained. In the case where the intensity of a gradient magnetic field varies non-linearly, the intensity of the x-gradient magnetic field and that of the y-gradient magnetic field can be expressed by $$G_x\{x+h_1(x, y)\}$$

and $$G_y\{y+h_2(x, y)\} \tag{12}$$

where $h_1(x, y)$ indicates the deviation of the intensity of the x-gradient magnetic field from a linearly-varying intensity, and $h_2(x, y)$ the deviation of the intensity of the y-gradient magnetic field from a linearly-varying intensity. In the present example, the two-dimensional signal $S(t_x, t_y)$ is given by the following equation:

$$S(t_x,t_y) = \int C(x, y) \exp[-2\pi j\gamma\{(E(x, y)+G_x(x+h_1(x, y))+(E(x, y)+G_y(y+h_2(x, y))t_y\}] dxdy \tag{13}$$

The above equation (13) can be converted into the equation (3) by using integral variables $x'$ and $y'$ which are given by the following equations:

$$\left. \begin{array}{l} x' = x + \dfrac{1}{G_x} E(x, y) + h_1(x, y) \\ y' = y + \dfrac{1}{G_t} E(x, y) + h_2(x, y) \end{array} \right\} \tag{14}$$

Accordingly, in the present example, the following equations (18) are used in place of the equations (8):

$$\left. \begin{array}{l} \xi' = I + \dfrac{1}{G_x} E(I, J) + h_1(I, J) \\ \eta' = J + \dfrac{1}{G_y} E(I, J) + h_2(I, J) \end{array} \right\} \tag{15}$$

That is, the deviation $E(I, J)$ with respect to the static magnetic field and the deviation $h_1(I, J)$ and $h_2(I, J)$ with respect to the gradient magnetic fields should be measured at each of positions corresponding to picture elements. Note that in equation (15), $G_x$ and $G_y$ are the increments per one picture element. The coordinates $\xi'$ and $\eta'$ are calculated from the equations (15), using the measured values of $E(I, J)$, $h_1(I, J)$, and $h_2(I, J)$. Then, values $i$, $j$, $\Delta_1$, and $\Delta_2$ for each position are determined as follows:

$$\left. \begin{array}{l} i = [\xi'], j = [\eta'] \\ \Delta_1 = \xi' - i, \Delta_2 = \eta' - j \end{array} \right\} \tag{16}$$

These data $i$, $j$, $\Delta_1$, and $\Delta_2$ are previously stored in the memory 18. Then, the spin density $C(I, J)$ at each position is calculated from the equation (10) (that is, by interpolation), using uncorrected image data $C(i, j)$, $C(i, j+1)$, $C(i+1, j)$, and $C(i+1, j+1)$ stored in memory 17 and data $i$, $j$, $\Delta_1$, and $\Delta_2$ stored in the memory 18. When the spin density $C(I, J)$ thus obtained is displayed on the CRT display 16, an image can be obtained in which the distortion due to both the non-uniformity of the static magnetic field and the non-linearity of the gradient magnetic fields has been corrected.

In the present example, the data $i$, $j$, $\Delta_1$, and $\Delta_2$ are stored in the memory 18. However, the data $E(I, J)$ with respect to the static magnetic field and the data $h_1(I, J)$ and $h_2(I, J)$ with respect to the gradient magnetic fields may be stored, instead of the data $i$, $j$, $\Delta_1$, and $\Delta_2$. In such a modified version of the present example, the computer 9 is required to perform arithmetic operations given by the equations (15) and (16), prior to the calculation for interpolation.

In the above description, the present invention has been explained for the case where the two-dimensional Fourier zeugmatography is used. However, the present invention is not limited to the two-dimensional Fourier zeugmatography, but is applicable to the spin warp imaging in a manner as mentioned below. (As mentioned previously, the spin warp imaging is another one of the direct Fourier imaging methods in which the values of the nuclear spin density distribution in a to-be-inspected body are measured at points on a rectangular coordinate system in the Fourier space.)

Figure 3:
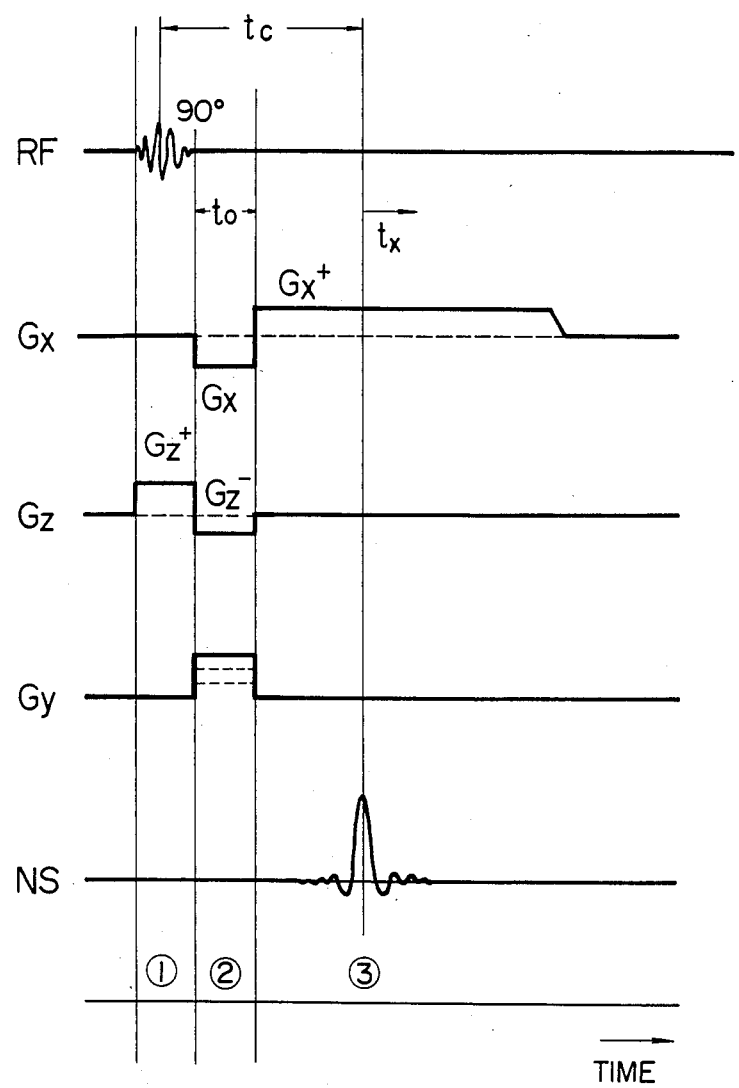

FIG. 3 shows an operation for deriving the image of a cross section by the two-dimensional spin warp imaging, and corresponds to FIG. 2 which shows an operation according to two-dimensional Fourier zuegmatography. In FIG. 3, the same reference symbols as in FIG. 2 are used in the same sense as in FIG. 2.

The spin warp imaging shown in FIG. 3 is different in the operation at a second period ② from the Fourier zeugmatography shown in FIG. 2. That is, in the Fourier zeugmatography, the period $t_y$ when the y-gradient magnetic field is applied, is set to have various values in the second period ② and measurement the NMR signal is measured for each value of the period $t_y$. While, in the spin warp imaging, the period $t_y$ is fixed (that is, the y-gradient magnetic field is applied for a fixed period $t_0$), but the amplitude of gradient $G_y$ is set to have various values. That is, the measurement of NMR signal is performed for each value of $G_y$. A two-dimensional signal $S(G_y, t_x)$ thus obtained is related to the actual spin density distribution $C(x, y)$, as mentioned below:

$$S(G_y, t_x) = \int C(x, y) \exp[-2\pi j\gamma\{(E(x,y)+G_x(x+h_1(x, y))t_x+E(x, y)t_c+G_y(y+h_2(x, y))t_0\}] dxdy \tag{17}$$

It is to be noted that a relaxation term is neglected in the equation (17) and the intensity of the y-gradient magnetic field is expressed by $G_y(y+h_2(x, y))$. Incidentally, reference symbol $t_c$ in FIG. 3 indicates a time interval between a time when a 90° RF pulse is applied and a time when the observation of spin echo is started. The equation (17) can be changed to the following equation:

$$S(G_y, t_x) = \int C(x,y) e^{-2\pi j\gamma E(x,y)t_c} \tag{18}$$

$$\exp[-2\pi j\gamma\{E(x,y) + G_x h_1(x,y) +$$

$$G_x x)t_x + G_y t_0(y + h_0(x,y))\}] dxdy$$

Now, let us perform the following transformation of coordinate system:

$$\left. \begin{array}{l} x' = x + \dfrac{1}{G_x} E(x, y) + h_1(x, y) \\ y' = y + h_2(x, y) \end{array} \right\} \tag{19}$$

Then, the equation (19) is changed to the following equation:

$$S(G_y,t_x) = \int C'(x',y') \exp[-2\pi j\gamma(G_x x' t_x + G_y y' t_0)]dxdy \quad (20)$$

From the equations (19), the coordinates x and y can be expressed as follows:

$$\left.\begin{array}{l} x = g_1(x', y') \\ y = g_2(x', y') \end{array}\right\} \quad (21)$$

By using the equations (21), the image data $C'(X', Y')$ is given by the following equation:

$$C'(x', y') = C(g_1(x',y'), g_2(x',y'))e^{-2\pi j\gamma E(g_1(x',y'),g_2(x',y'))/c} \quad (22)$$

Thus, the absolute value of the image is given as follows:

$$|C'(x',y')| = |C(g_1(x',y'), g_2(x',y'))| \quad (23)$$

The equation (23) shows that the absolute value of the image data is distorted by the non-uniform intensity distribution of a static magnetic field and the non-linear intensity distribution of gradient magnetic fields. Such a distortion can be corrected in the same manner as in the previously-mentioned Fourier zeugmatography, except that the following equation (24) are used in place of the equations (8).

$$\left.\begin{array}{l} \xi = I + \dfrac{1}{G_x} E(I, J) + h_1(I, J) \\ \eta = J + h_2(I, J) \end{array}\right\} \quad (24)$$

where $G_x$ indicates the intensity increment of the x-gradient magnetic field per one picture element, as in the equations (8) and (15).

The above-mentioned processing for the correction is performed by the embodiment shown in FIG. 1, in accordance with the following procedure. The error $E(I, J)$ in a static magnetic field and errors $h_1(I, J)$ and $h_2(I, J)$ in gradient magnetic fields are measured at each of the positions corresponding to picture elements, and then the coordinates $\xi$ and $\eta$ are calculated from the equations (24). The values (i, j) and $(\Delta_1, \Delta_2)$ are determined by the equations (9), and stored in the memory 18. The computer 9 performs the arithmetic operation for interpolation given by the equation (10), for each of the positions corresponding to the picture elements, using the data stored in the memory 18 and uncorrected image data $C'(I', J')$ stored in the memory 17. The results of the above arithmetic operation are displayed, as the image data C(I, J), on the CRT display 16.

Further, in this case, measured data E(I, J), $h_1(I, J)$, and $h_2(I, J)$ indicating errors in the magnetic fields may be stored in the memory 18, provided that the computer 9 performs the arithmetic operations given by the equations (24) and (9), prior to the arithmetic operation for interpolation.

As can be seen from the equations (19) and (20), according to the spin warp imaging, the non-uniformity of the static magnetic field causes a distortion only in the x-direction of the image, and does not cause any distortion in the y-direction, if the deviation of the intensity distribution of each gradient magnetic field from a linear intensity distribution is negligibly small. In this case, only the values $\xi$, i, and $\Delta_i$ are determined by the following equations:

$$\xi = I + (1/G_x)E(I, J) \quad (25)$$

$$i = [\xi] \quad (26)$$

$$\Delta_1 = \xi - i \quad (27)$$

Further, in order to correct the distortion of the image, the computer 9 performs the following arithmetic operation for interpolation between two points:

$$C(I, J) = (1-\Delta_1)C'(i, J) + \Delta_1 C'(i+1, J) \quad (28)$$

In the foregoing description, explanation has been made using the original sequences which have been devised by the proposers of each of the Fourier zeugmatography and the spin warp imaging. However, in addition to the original sequences, various modified sequences are now used which are improved versions of the original sequences. Now, the present invention will be explained for the case where the improved sequences are used.

Figure 4:
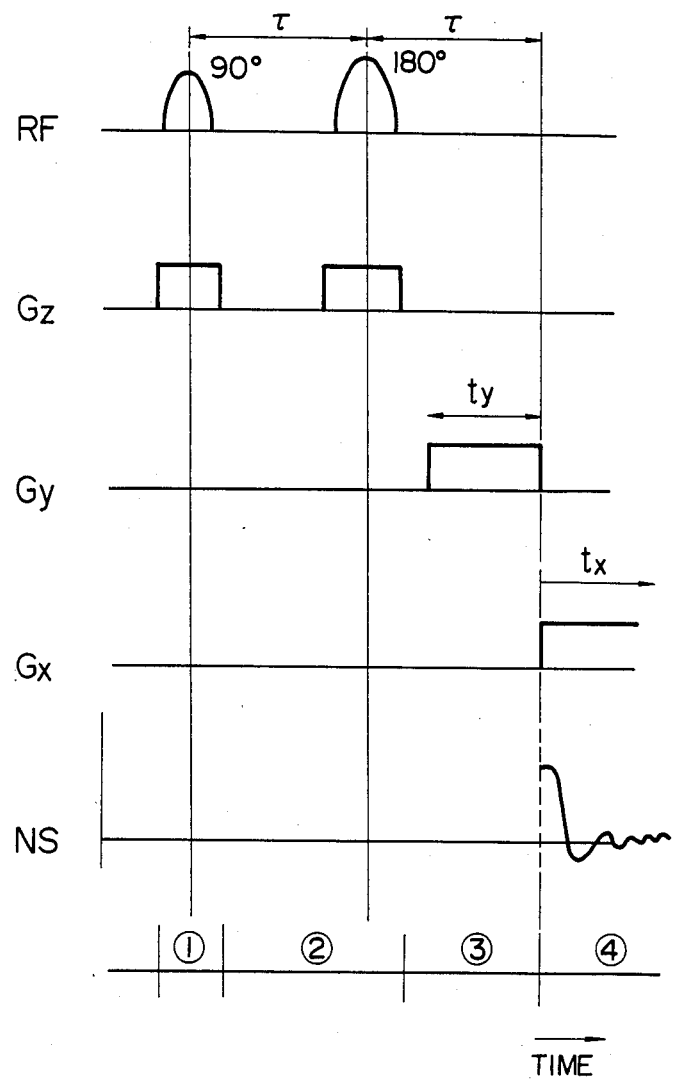

FIGS. 4 and 5 show examples of the improved sequences. The main feature of the sequences shown in FIGS. 4 and 5 resides in that a spin echo is formed by using a 180° pulse.

The operation at each of first, second, third, and fourth periods ①, ②, ③ and ④ shown in FIG. 4 will be explained below, by way of example.

At the first period ①, a 90° RF pulse according to the selective irradiation method is emitted while applying the z-gradient magnetic field to the to-be-inspected body, so that the nuclear spin in a specified cross section parallel to the x-y plane is inclined by an angle of 90°. For details of the RF pulse according to the selective irradiation method, an article entitled "Medical Imaging by NMR" (British J. of Radiography, Vol. 50, 1977, pages 188 to 194) should be referred to.

At the second period ②, a 180° RF pulse according to the selective irradiation method is emitted when a time $\tau$ has elapsed after the 90° RF pulse was emitted, and thus the nuclear spin in the cross section which is selected at the first period, is reversed in orientation, to observe an echo signal when a time $2\tau$ has elapsed after the 90° RF pulse was emitted.

At the third period ③, the y-gradient magnetic field is applied for a time $t_y$.

At the fourth period ④, the x-gradient magnetic field is applied and the measurement of the echo signal is started, immediately after the y-gradient magnetic field is removed.

The time $t_y$ (that is, a period when the y-gradient magnetic field is applied) is set to various values, and the above measurement is made for each of such values. A two-dimensional signal $S(t_x, t_y)$ thus obtained is given as follows:

$$S(t_x,t_y) = \int C(x,y)\exp[2\pi j\gamma\{G_y y t_y + (E(x,y) + G_x x)t_x\}]dxdy \quad (29)$$

In deriving equation (29), it is assumed that field gradient non-linearities are negligible. It is to be noted that the non-uniformity of the static magnetic field has no effect on the image in the y-direction, as in the spin warp imaging shown in FIG. 3. This is because an echo is formed by using the 180° RF pulse.

The sequence shown in FIG. 5 is different from that shown in FIG. 4 in that the y-gradient magnetic field is applied for a fixed time $t_0$, and the amplitude thereof is set to various values. Accordingly, in this case, a two-dimensional signal $S(t_x, G_y)$ is given as follows:

$$S(t_x, G_y) = \int C(x,y) \exp[-2\pi j\gamma\{G_y y t_0 + (E(x,y) + G_x x)t_x\}] dx dy \quad (30)$$

Thus, the non-uniformity of the static magnetic field produces no effect on the image in the y-direction. Accordingly, in the case where either one of the sequences shown in FIGS. 4 and 5 is used, the distortion of the image can be corrected in the same manner as the absolute value of the image data which is obtained by using the sequence shown in FIG. 3, is corrected. That is, in the case where it is required to correct the distortion caused only by the non-uniformity of the static magnetic field, the coordinate $\xi$ is calculated from the equation (25), and correction is made by the equation (28). Further, in the case where it is required to correct the distortion caused by both the non-uniformity of the static magnetic field and the non-linearity of the gradient magnetic fields, the coordinates $\xi$ and $\eta$ are calculated from the equations (24), and correction is made by the equation (10).

In various examples mentioned above, the deviation $E(I, J)$ of the intensity of the static magnetic field from a standard value and the deviation $h_1(I, J)$ and $h_2(I, J)$ of respective intensities of the gradient magnetic fields from linearly-varying intensities are measured at each of the positions corresponding to picture elements, and data necessary for correcting the distortion of the image are calculated from the measured values, to be stored in the memory 18. However, it takes a lot of time to obtain the measured values. Accordingly, the deviation with respect the static magnetic field and the deviation with respect to the gradient magnetic field may be measured at intervals of several positions, to determine deviation values at the positions where measurement is not made, by interpolation. Further, in the case where the intensity distribution of the static magnetic field and that of each gradient magnetic field can be approximated with some functions, the values of the deviation $E(I, J)$, $h_1(I, J)$, and $h_2(I, J)$ used in the above-mentioned examples may be calculated from such functions.

In the foregoing description, various examples of the correction according to the present invention have been explained on the assumption that the formulae (5) hold. However, in the case where the intensity distribution of the static magnetic field is extremely non-uniform, the formulae (5) do not hold, and therefore the denominator on the right-hand side of the equation (4) has to be corrected.

Now, the processing in such a case will be explained below.

When the denominator on the right-hand side of the equation (4) is expressed by W, the denominator W is given as follows:

$$W = 1 + \frac{1}{G_y} \frac{\partial E(x,y)}{\partial y} + \frac{1}{G_x} \frac{\partial E(x,y)}{\partial x} \quad (31)$$

By using discrete variables I and J in place of the continuous variables x and y, the equation (31) is changed to the following equation:

$$W = 1 + \quad (32)$$

$$\frac{1}{G_y}\{E(I, J+1) - E(I,J)\} + \frac{1}{G_x}\{E(I+1, J) - E(I,J)\}$$

where $G_x$ indicates the field gradient increment per one picture element in the x-direction, and $G_y$ the field gradient increment per one picture element in the y-direction. As mentioned previously, the value of $E(I, J)$ can be determined by measurement.

In order to obtain corrected image data $C(I, J)$ for a picture element in the J-th row, the I-th column, the values i, j, $\Delta_1$, and $\Delta_2$ are determined from the equations (9) on the basis of the equations (8) (for the Fourier zeugmatography) or the equations (24) (for the spin warp imaging), and then the value of g is calculated from the equation (10). Next, the value of W is calculated from the equation (32), to determine the corrected image data $C(I, J)$ as follows:

$$C(I, J) = gW \quad (33)$$

Thus, even in the case where the intensity distribution of the static magnetic field is extremely non-uniform so that the formulae (5) do not hold, the distortion of the image caused by the non-uniformity of the static magnetic field can be corrected.

Now, a method of measuring the intensity distribution of a magnetic field in a field of view will be additionally explained. The present invention deals with the non-linearity of a static magnetic field and the non-linearity of a gradient magnetic field which correspond to about 0.001 percent of the intensity of the static magnetic field. Such high-accuracy measurement cannot be made by a conventional magnetic field measuring instrument (since the measuring accuracy of, for example, a gaussmeter is about 0.1 percent of the intensity of a static magnetic field), but can be carried out by a method which utilizes the NMR phenomenon in the following manner. That is, the frequency of the resonance signal is measured at various positions in a field of view by moving a probe which is formed by winding a signal detecting coil round a tube having a diameter of about 1 mm and filled with a substance to be imaged (for example, water). The frequency f of the resonance signal is proportional to the intensity H of the magnetic field, and the proportional constant is equal to a gyromagnetic ratio. Accordingly, the value of the magnetic field intensity H at a position can be determined very accurately from the frequency f of the resonance signal obtained at this position.

We claim:

1. An imaging apparatus using nuclear magnetic resonance comprising:

means for forming a substantially homogeneous static magnetic field which has a deviation distribution from a predetermined intensity within a predetermined field of view;

means for forming a first and a second gradient magnetic field in said field of view along directions perpendicular to each other;

means for forming a high-frequency magnetic field pulse in said field of view to excite spins in a to-be-inspected body;

means for detecting resonance signals of spins from the to-be-inspected body placed in said field of view;

computer means for controlling said gradient field forming means and said high-frequency magnetic field forming means so that a sequential operation is effected including exciting nuclear spins in said body by said high-frequency magnetic field pulse, and forming said first gradient magnetic field and detecting resonance signals of said spins under a condition that said second gradient magnetic field is formed, and for repeating said sequential operation wherein for each repetition time, the amplitude or the time length of application of said first gradient magnetic field is successively changed, and for performing a two-dimensional Fourier transformation on a data set detected through repeating of said sequential operation so as to provide a first image data indicative of the spin distribution of said body;

a first memory for storing therein said first image data, said first image data being indicative of the spin distribution of said body and including geometrical distortion caused by said deviation distribution of said static magnetic field; and a second memory for storing therein data for correcting the geometrical distortion of said first image data, said data for correcting being previously calculated from measured values indicative of the intensity distribution of said static magnetic field along the entire area of said field of view;

said computer means deriving a second image data for display by reading out said first image data and said data for correcting and for correcting the geometrical distortion of said first image data so as to provide said second image data.

2. An imaging apparatus using the nuclear magnetic resonance according to claim 1, wherein coordinates $\xi$ and $\eta$ of said first image data corresponding to coordinates I and J on a to-be-displayed image (where $I=0, 1, \ldots, N-1; J=0, 1, \ldots, N-1$) are divided into discrete coordinate components i and j and error components $\Delta_1$ and $\Delta_2$ as indicated by equations $\Delta_1=\xi-i$ and $\Delta_2=\eta-j$, and said second memory stores therein said discrete coordinate components i and j and said error compohents $\Delta_1$ and $\Delta_2$.

3. An imaging apparatus using the nuclear magnetic resonance according to claim 2, wherein said coordinates $\xi$ and $\eta$ and are corrected by said components i, j, $\Delta_1$, and $\Delta_2$ in such a manner that said second image data is obtained by interpolation from said first image data at four positions having coordinates i and j, coordinates i and j +1, coordinates i+1 and j, and coordinates i+1 and j+1.

4. An imaging apparatus using the nuclear magnetic resonance according to claim 2, wherein said coordinates $\xi$ and $\eta$ are calculated substantially from the following equations:

$$\xi = I + (1/G_x)E(I, J)$$

$$\eta = J + (1/G_y)E(I, J;)$$

where $G_x$ indicates an intensity increment of a gradient magnetic field having an intensity gradient in an x-direction per one picture element, $G_y$ an intensity increment of a gradient magnetic field having an intensity gradient in a y-direction per one picture element, and E (I,J) the deviation of the intensity of said static magnetic field from a predetermined value at a position having coordinates I and J.

5. An imaging apparatus using the nuclear magnetic resonance according to claim 1, wherein a 180° high-frequency pulse is applied to said to-be-inspected body to detect said nuclear magnetic resonance signal, and wherein one coordinate $\xi$ of coordinates $\xi$ and $\eta$ of said first image data corresponding to coordinates I and J on a to-be-displayed image is divided into a discrete coordinate component i and an error component $\Delta_1$ as indicated by an equation $\Delta_1=\xi-i$, and said second memory stores error therein said coordinate component i and said component $\Delta_1$.

6. An imaging apparatus using the nuclear magnetic resonance according to claim 5, wherein said coordinate $\xi$ is corrected by said components i and $\Delta_1$ in such a manner that said second image data is obtained by interpolation from said first image data at two position having coordinates i and J and coordinates i+1 and J.

7. An imaging apparatus using the nuclear magentic resonance according to claim 5, wherein said coordinate $\xi$ is calculated from the following equation:

$$\xi = I + (1/G_x)E(I, J)$$

wherein $G_x$ indicates an intensity increment of a gradient magnetic field having an intensity gradient an an x-direction per one picture element, and E (I, J) the deviation of the intensity of said static magnetic field from a predetermined value at a position having coordinates I and J.

8. An imaging apparatus using nuclear magnetic resonance comprising:

means for forming a substantially homogeneous static magnetic field which has a deviation distribution from a predetermined intensity witin a predetermined field of view;

means for forming a first and a second gradient magnetic field in said field of view along directions perpendicular to each other, said first and second gradient magnetic fields having deviation distributions from a predetermined linearly-varying intensity;

means for forming a high-frequency magnetic field pulse in said field of view to excite spins in a to-be-inspected body;

means for detecting resonance signals of spins from the to-be-inspected body placed in said field of view;

computer means for controlling said gradient field forming means and said high-frequency magnetic field forming means so that a sequential operation is effected including exciting nuclear spins in said body by said high-frequency magnetic field pulse, and forming said first gradient magnetic field and detecting resonance signals of said spins under a condition that said second gradient magnetic field is formed, and for repeating said sequential operation wherein for each repetition time, the amplitude or the time length of application of said first gradient magnetic field is successively changed, and for performing a two-dimensional Fourier transformation on a data set detected through repeating of said sequential operation so as to provide a first image data indicative of the spin distribution of said body;

a first memory for storing therein said first image data, said first image data being indicative of the spin distribution of said body and including geometrical distortion caused by the deviation distribution of said static magnetic field and the deviation distributions of said first and second gradient magnetic field; and a second memory for storing therein data for correcting the geometrical distortion of said first image data, said data for correcting being previously calculated from measured values indicative of the intensity distribution of said static magentic field and the deviation distributions of said first and second gradient magnetic fields along the entire area of said field of view;

said computer means deriving a second image data to be displayed on a display device by reading out said first image data and said data for correcting from said first and second memories and for correcting said geometrical distortion of said first image data to provide said second image data.

9. An imaging apparatus using the nuclear magnetic resonance according to claim 8, wherein coordinates $\xi$ and $\eta$ of said first image data corresponding to coordinates I and J on a to-be-displayed image (where I=0, 1, ... N−1; J=0, 1, ..., N−1) are divided into discrete coordinate components i and j and error components $\Delta_1$ and $\Delta_2$ as indicated by equations $\Delta_{1i} = \xi - i$ and $\Delta_2 = \eta - j$, and said second memory stores therein siad discrete coordinate components i and j and said error components $\Delta_1$ and $\Delta_2$.

10. An imaging apparatus using the nuclear magnetic resonance according to claim 9, wherein said coordinates $\xi$ and $\eta$ calculated substantially from the following equations:

$$\xi = I + (1/G_x)\{E(I,J) + h_1(I,J)\}$$

$$\eta = J + (1/G_y)\{E(I,J) + h_2(I,J)\}$$

were $G_x$ indicates an intensity increment of a gradient magnetic field having an intensity gradient in an x-direction per one picture element, $G_y$ an intensity increment of a gradient magnetic field having an intensity gradient in a y-direction per one picture element, E (I, J) the deviation of the intensity of said static magnetic field from a predetermined value at a position having coordinates I and J, $h_1$ (I, J) the deviation of the intensity of said gradient magnetic field having an intensity gradient in the x-direction from a predetermined, linearly-varying intensity at said position having the coordinates I and J, and $h_2$ (I, J) the deviation of the intensity of said gradient magnetic field having an intensity gradient in the y-direction from a predetermined, linearly-varying intensity at said position having the coordinates I and J.

11. An imaging apparatus using the nuclear magnetic resonance according to claim 9, wherein a 180° high-frequency pulse is applied to said to-be-inspected body to detect said nuclear magnetic resonance signal, and said coordinats $\xi$ and $\eta$ are calculated from the following equations:

$$\xi = I + (1/G_x)\{E(I, J) + h_1(I, J)\}$$

$$\eta = J + h_2(I, J)$$

where x is taken in the direction of the gradient of a gradient magnetic field applied for measuring a nuclear magnetic resonance signal, $G_x$ indicates an intensity increment of a gradient magnetic field having an intensity gradient in an x-direction per one picture element, E (I, J) the deviation of the intensity of said static magnetic field from a predetermined value at a position having coordinates I and J, $h_1$ (I, J) the deviation of the intensity of said gradient magnetic field having an intensity gradient in the x-direction from a predetermined, linearly-varying intensity at said position having the coordinates I and J, and $h_2$ (I, J) the deviation of the intensity of a gradient magnetic field having an intensity gradient in a y-direction from a predetermined, linearly-varying intensity at said position having the coordinates I and J.

12. An imaging apparatus using the nuclear magnetic resonance according to claim 9, wherein said coordinates $\xi$ and $\eta$ are corrected by said components i, j, $\Delta_1$, and $\Delta_2$ in such a manner that said second image data is obtained by interpolation from said first image data at four positions having coordinates i and j, coordinates i and j+1, coordinates i+1 and j, and coordinates i+1 and j+1.

13. An imaging method using nuclear magnetic resonance comprising:

forming a substantially homogeneous static magnetic field which has a deviation distribution from a predetermined intensity within a predetermined field of view;

forming a first and a second gradient magnetic field in the field of view along directions perpendicular to each other;

forming a high-frequency magnetic field pulse in the field of view to excite spins in a to-be-insoected body;

detecting the resonance signals of spins from the to-be-inspected body placed in the field of view;

controlling the formation of the gradient fields and the high-frequency magnetic field so that a sequential operation is effected including exciting nuclear spins in the body by the high-frequency magnetic field pulse, and forming the first gradient magnetic field and detecting resonance signals of the spins under a condition that the second gradient magnetic field is formed, and repeating the sequential operation wherein for each repetition time, the amplitude or the time length of application of the first gradient magnetic field is successively changed, and for performing a two-dimensional Fourier transformation on a data set detected through repeating of the sequential operation so as to provide a first image data indicative of the spin distribution of the body;

storing in a first memory the first image data, the first image data being indicative of the spin distribution of the body and including geometrical distortion caused by the deviation distribution of the static magnetic field; and storing in a second memory data for correcting the geometrical distortion of the first image data, the data for correcting being previously calculated from measured values indicative of the intensity distribution of the static magnetic field along the entire area of the field of view;

deriving a second image data by reading out the first image data and the data for correcting and correcting the geometrical distortion of the first image data so as to provide the second image data; and displaying the second image data on a display device.

14. An imaging method according to claim 13, wherein the first and second gradient magnetic fields are formed with deviation distributions from a predetermined, linearly-varying intensity, and the second memory stores the data for correcting including data previously calculated from measured values indicative of the deviation distribution of the first and second gradient magnetic fields along the entire area of the field of view.

15. An imaging apparatus using nuclear magnetic resonance comprising:
   means for forming a substantially homogeneous static magnetic field which has a deviation distribution from a predetermined intensity within a predetermined field of view;
   means for forming a first and a second gradient magnetic field in said field of view along directions perpendicular to each other;
   means for forming a high-frequency magnetic field pulse in said field of view to excite spins in a to-be-inspected body;
   means for detecting the resonance signals of spins from the to-be-inspected body placed in said field of view;
   computer means for controlling said gradient field forming means and said high-frequency magnetic field pulse so that a sequential operation is effected including exciting nuclear spins in said body by said high-frequency magnetic field pulse, and forming said first gradient magnetic field and detecting resonance signals of said spins under a condition that said second gradient magnetic field is formed, and for repeating said sequential operation wherein for each repetition time, the amplitude or the time length of application of said first gradient magnetic field is successively changed, and for performing a two-dimensional Fourier transformation on a data set detected through repeating of the sequential operation so as to provide a first image data indicative of the spin distribution of the body;
   a first memory for storing therein said first image data, said first image data being indicative of the spin distribution of said body and including geometrical distortion caused by said deviation distribution of said static magnetic field;
   means for measuring an intensity distribution of said static magnetic field along the entire area of said field of view; and
   a second memory for storing therein data for correcting the geometrical distortion of said first image data, said data for correcting being previously calculated from measured values indicative of the intensity distribution of said static magnetic field along the entire area of said field of view;
   said computer means deriving a second image data for display by reading out said first image data and said data for correcting from said first and second memories, and by correcting said geometrical distortion of said first image data so as to provide the second image data.

16. An imaging method using a nuclear magnetic resonance imaging system having means for producing a static magnetic field which is substantially homogeneous along the entire area of a field of view, the method comprising steps of:
   (a) measuring an intensity distribution of said static magnetic field along the entire area of said field of view,
   (b) calculating and storing data for correcting a geometrical distortion of an image caused by said intensity distribution of said static magnetic field,
   (c) exciting nuclear spins of a to-be-inspected body disposed in said field of view,
   (d) applying a first gradient magnetic field along a first direction to encode positional information along the first direction on a phase of said spins,
   (e) applying a second gradient magnetic field along a second direction perpendicular to said first direction,
   (f) detecting data of resonant signals of said spins under a condition that said second gradient magnetic field is applied and storing the detected data,
   (g) repeating the steps (c) to (f) while successively changing the amplitude or the time length of application of said first magnetic field each repetition time,
   (h) performing a two-dimensional Fourier transformation on a data set detected and stored by the repetition of steps to provide a first image data which includes the geometrical distortion caused by the intensity distribution of said static magnetic field, and
   (i) providing second image data to be displayed on a display device by correcting the geometrical distortion of said first image data using said data for correcting.

* * * * *